(12) United States Patent
Chang et al.

(10) Patent No.: US 7,563,732 B2
(45) Date of Patent: Jul. 21, 2009

(54) METHOD AND APPARATUS FOR FORMING POLYCRYSTALLINE LAYER USING LASER CRYSTALLIZATION

(75) Inventors: Shih-Chang Chang, Hsinchu (TW); Yaw-Ming Tsai, Taichung Hsien (TW); Ryan Lee, Hualien (TW); Yu-Ting Hung, Sinying (TW)

(73) Assignee: TPO Displays Corp., Chu-Nan (TW)

( * ) Notice: Subject to any disclaimer, the term of this patent is extended or adjusted under 35 U.S.C. 154(b) by 207 days.

(21) Appl. No.: 10/987,037

(22) Filed: Nov. 12, 2004

(65) Prior Publication Data
US 2005/0148208 A1 Jul. 7, 2005

(30) Foreign Application Priority Data
Jan. 2, 2004 (TW) .............................. 93100045 A

(51) Int. Cl.
*H01L 21/00* (2006.01)
(52) U.S. Cl. ...................... 438/795; 438/487; 438/463; 438/949
(58) Field of Classification Search ................. 438/795, 438/463, 487, FOR. 240, FOR. 289, 731, 438/166, 464, 473, 949, FOR. 136, FOR. 439; 257/659, 660
See application file for complete search history.

(56) References Cited

U.S. PATENT DOCUMENTS

| 5,864,150 | A  | * | 1/1999 | Lin ............................. 257/61 |
| 2002/0068391 | A1 | * | 6/2002 | Jung ........................... 438/166 |
| 2005/0061443 | A1 | * | 3/2005 | Nakano et al. .......... 156/345.44 |

* cited by examiner

*Primary Examiner*—Phuc T Dang
*Assistant Examiner*—Thanh Y Tran
(74) *Attorney, Agent, or Firm*—Liu & Liu

(57) ABSTRACT

A method and an apparatus for forming a polycrystalline layer using laser annealing for preventing damage to the peripheral region of the substrate during laser annealing. The laser annealing comprises a shadow mask structure. When crystallizing an amorphous layer by laser annealing, the shadow mask structure shields the peripheral region of the amorphous layer from laser irradiation. A method for forming a polycrystalline layer using the laser annealing apparatus is also provided in the invention.

12 Claims, 7 Drawing Sheets

METHOD AND APPARATUS FOR FORMING POLYCRYSTALLINE LAYER USING LASER CRYSTALLIZATION

BACKGROUND OF THE INVENTION

1. Field of the Invention

The present invention relates to a method and apparatus for forming a polycrystalline layer using laser crystallization, and more particularly, to a method and apparatus for forming low temperature polysilicon (LTPS) using sequential lateral solidification (SLS) excimer laser annealing.

2. Description of the Related Art

Thin film transistors are typically employed as active elements for driving active matrix liquid crystal displays (LCDs), active matrix organic light-emitting displays (OLEDs), and the like. The silicon layer in the thin film transistor comprises a polysilicon or amorphous silicon (a-Si:H) layer.

Amorphous silicon has advantages such as lower process temperature, easy mass production by chemical vapor deposition, and high production yield due to mature process technique. On the other hand, polysilicon possesses excellent conductivity and high field effect mobility such that the transistor can be applied in high speed operating circuits, and offers excellent integration of driving circuits. With the development of low temperature processes, polysilicon TFTs can replace amorphous silicon TFTs.

There are three conventional methods for fabricating a polysilicon layer. The first method forms a polysilicon layer using conventional high temperature deposition method. The second method forms an amorphous silicon layer, followed by heating and crystallizing to form a polysilicon layer. The third method forms an amorphous silicon layer, followed by laser irradiating and crystallizing to form a polysilicon layer. However, the first method has the disadvantage of quite thick deposition of polysilicon to form a large grain polysilicon layer and poor uniformity. The second method is capable of growing a thin and uniform polysilicon thin film but suffering slow throughput and low yield resulting from holding for several hours at about 600° C. The third method, such as an excimer laser annealing (ELA) process, has a lower temperature requirement, but undergoes quite slow throughput due to a slow scan speed of 6 mm/sec and irradiation energy of 370 mJ/cm$^2$. The sequential lateral solidification (SLS) method offers a higher scan speed of 300 mm/sec and higher irradiation energy of 600 mJ/cm$^2$, and thus the throughput is raised. FIG. 1 illustrates the thickness distribution of an amorphous layer 14 deposited on a buffer layer 12 over a glass substrate 10. The amorphous silicon layer 14 in the peripheral region A is thinner than that in the main area C. The thinner amorphous silicon layer region (i.e., peripheral region A) may be destroyed due to laser irradiation with slow scan speed. Besides, alignment marks located in the peripheral region A may be also destroyed too. Thus, it may impede the subsequent process.

Accordingly, the sequential lateral solidification (SLS) laser annealing process requires an extended distance for acceleration of the annealing apparatus to a scan speed of 300 mm/sec prior to reaching the peripheral sections. More specifically, the SLS laser needs to start irradiation and gets up to constant speed from outside of the glass substrate. This creates the problem of needs more space outside the substrate.

To prevent the amorphous silicon layer 14 in the peripheral region A from damage by laser irradiation, a line beam laser irradiates the uniform region of the amorphous layer 14 in the main region C. Since the sequential lateral solidification (SLS) laser annealing process irradiates from the outside of the glass substrate, the shutter of the laser annealing apparatus is controlled to be opened only when directed at the uniform region for preventing damage to the peripheral region A of the amorphous layer 14 by laser irradiation. In FIG. 1, the shutter opens at D and E; and is fully open at d and e. The region wherein the shutter is not fully open does not receive enough irradiation energy to crystallize the amorphous layer 14 hence the polycrystalline area of the substrate is reduced.

SUMMARY OF THE INVENTION

The present invention provides a laser annealing apparatus that prevents the amorphous layer from damage in the peripheral region A.

The present invention provides a method for preventing the amorphous layer damage in the peripheral region A by laser irradiation without reducing the polycrystalline area of the substrate.

The present invention provides a shadow mask structure installed in laser annealing apparatus for preventing the amorphous layer from damage in the peripheral region by laser irradiation.

In one aspect of the present invention, a laser annealing apparatus for fabricating a polycrystalline layer is provided. The apparatus comprises a movable stage for placing a substrate, and a shadow mask structure for shielding the peripheral region of the substrate.

It should be noted that the shadow mask structure can comprise a baffle plate, and a support structure fixed to the movable stage for supporting the shadow mask structure. Alternatively, the shadow mask structure can also comprise a baffle plate, and a resilient structure for supporting the shadow mask structure, enabling the shadow mask structure to expand and contract.

In another aspect of the present invention, a method for fabricating a polycrystalline layer using laser annealing is provided. The method comprises providing a substrate comprising an amorphous layer thereon, the substrate is placed on the movable stage in a process chamber, wherein the process chamber comprises a shadow mask structure to shield the peripheral region of the substrate, adjusting the shadow mask structure to cover the peripheral region of the substrate, and performing laser annealing on the amorphous layer to form a polycrystalline layer.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

To prevent damage to the peripheral region of the amorphous layer by high energy and high scan speed laser irradiation, the present invention provides an improved laser annealing apparatus.

Figure 1:
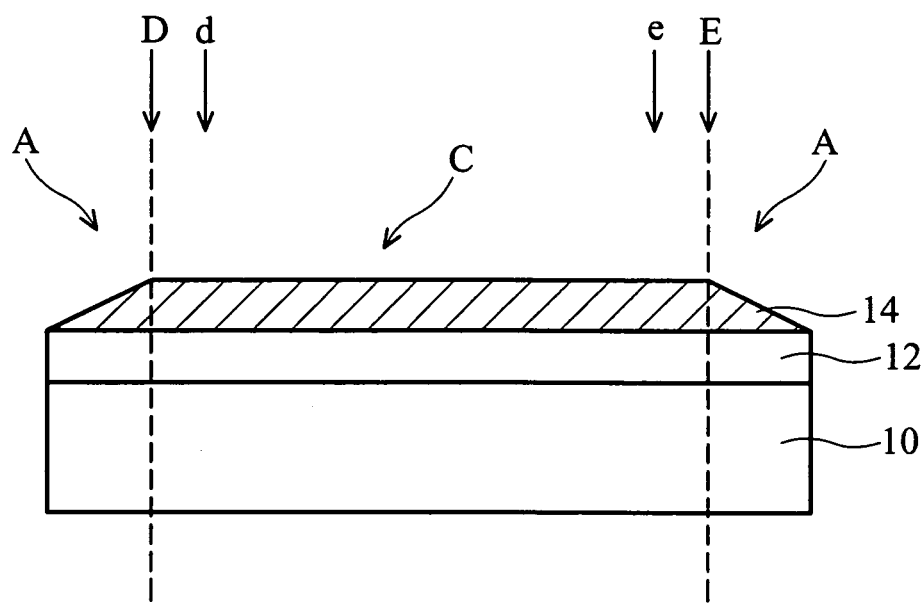
FIG. 1 shows an amorphous layer deposited on a buffer layer on a glass substrate.
Figure 2:
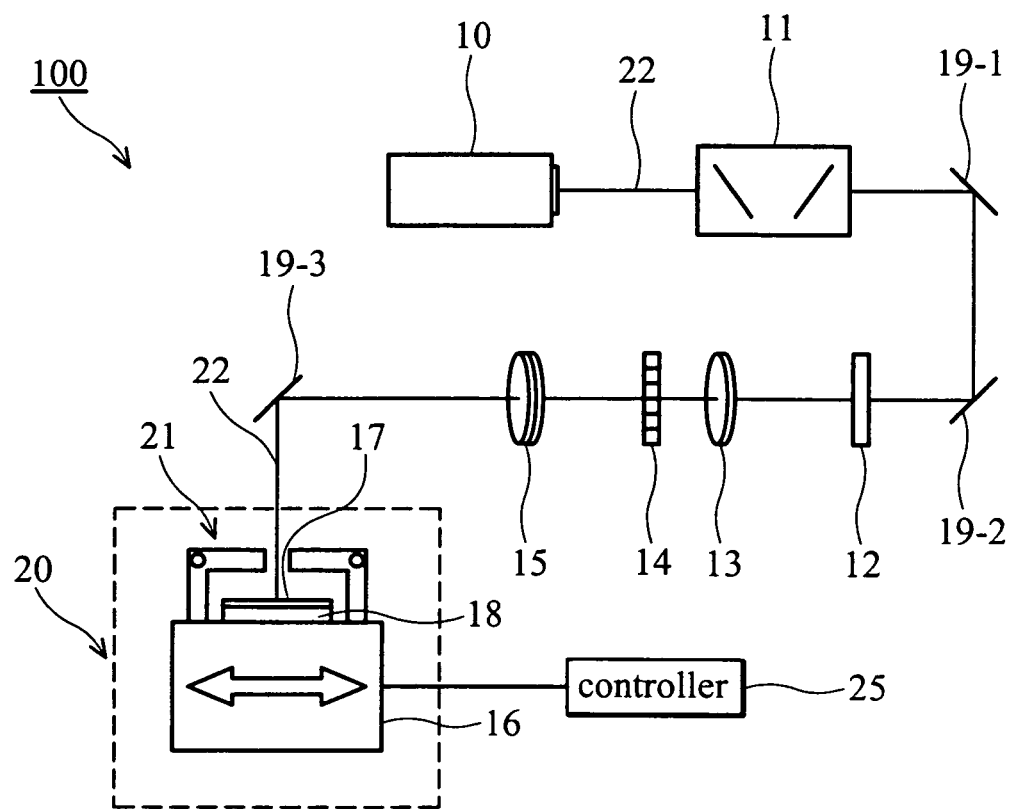
FIG. 2 shows a laser annealing apparatus for use in sequential lateral solidification (SLS) in accordance with one embodiment of the present invention.

When crystallizing an amorphous silicon layer by SLS, a laser beam is patterned with a predetermined shape, and the amorphous silicon film is continuously irradiated with the patterned laser beam. FIG. 2 shows a laser annealing apparatus 100 for use in sequential lateral solidification (SLS) in accordance with one embodiment of the present invention.

For crystallizing the amorphous silicon layer, an initial laser beam 22 irradiates from a laser source 10 and passes through an attenuator 11, a homogenizer 12, and a field lens 13, thereby both controlling the energy of and condensing the laser beam 22.

The laser beam 22 is subsequently patterned with a predetermined shape by passing the beam through a mask 14. After the patterned laser beam has passed through an object lens 15, the laser beam irradiates an amorphous silicon layer 17 placed on a movable stage 16, such as an x-y stage inside a process chamber 20, transforming the amorphous layer to a polycrystalline layer. The peripheral region of the substrate 18 is totally or partially covered by a shadow mask structure 21. Mirrors 19-1, 19-2, and 19-3 are provided for controlling the path of the laser beam 22 in the laser optical system. The relative motion of the laser beam 22 and the movable stage 16 is controlled by a controller 25 to expose the surface of the amorphous silicon layer to the laser beam 22. Other than the process chamber 20 in accordance with embodiment of the present invention, the remain components of the laser annealing system may adopt convention laser annealing systems.

Figure 3:
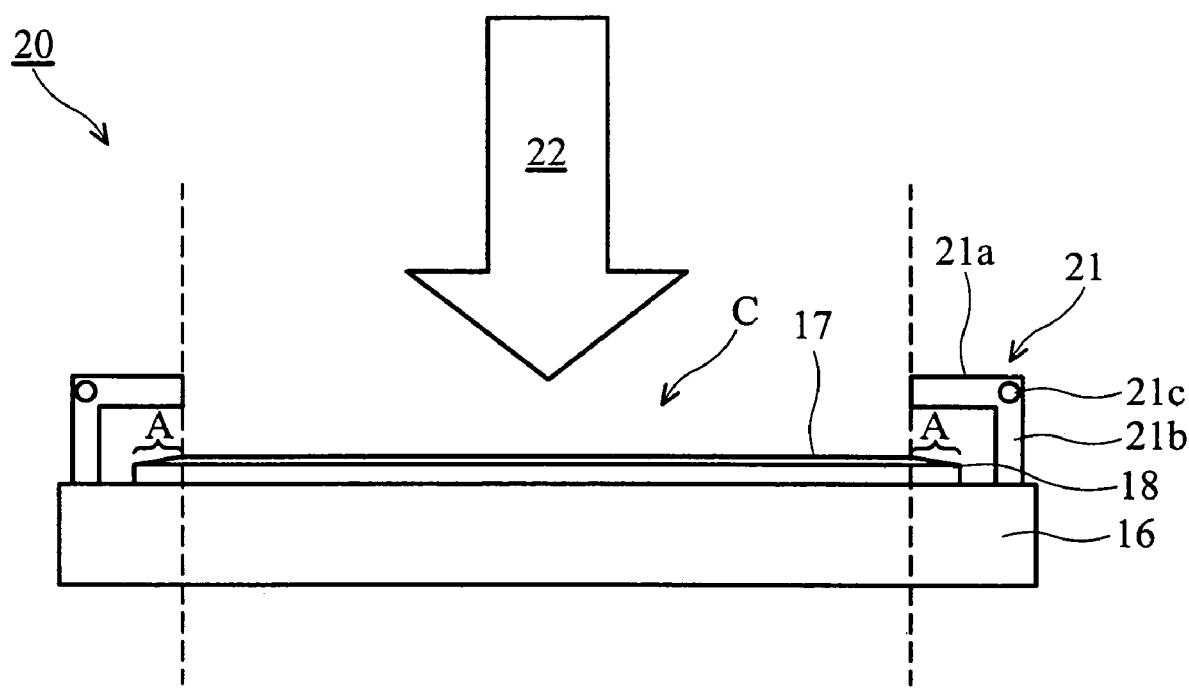
FIG. 3 is a schematic view of a process chamber for a laser annealing apparatus in accordance with one embodiment of the present invention.

In FIG. 2, a process chamber 20 for a laser annealing system of a preferred embodiment is provided. FIG. 3 schematically shows a process chamber 20 for a laser annealing apparatus according to an embodiment of the present invention.

Figure 4A:
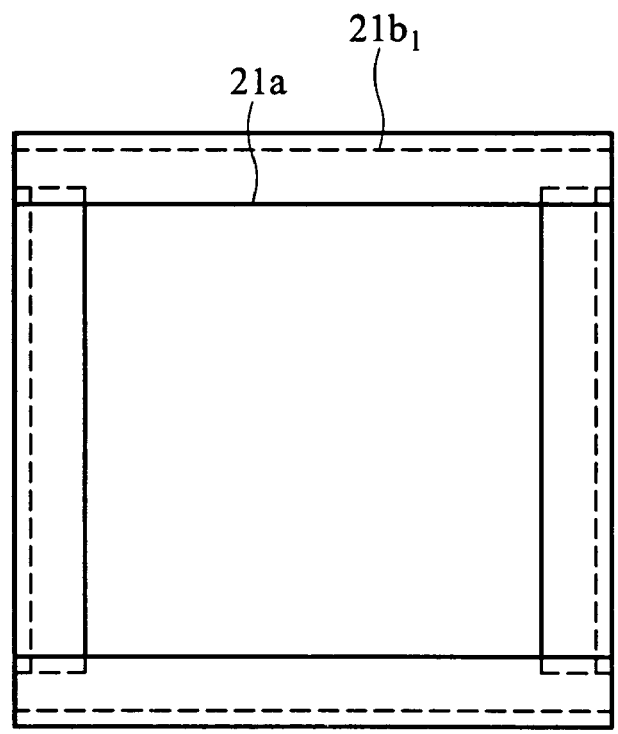
FIG. 4A is a top view of a shadow mask structure of one embodiment of the present invention.
Figure 4B:
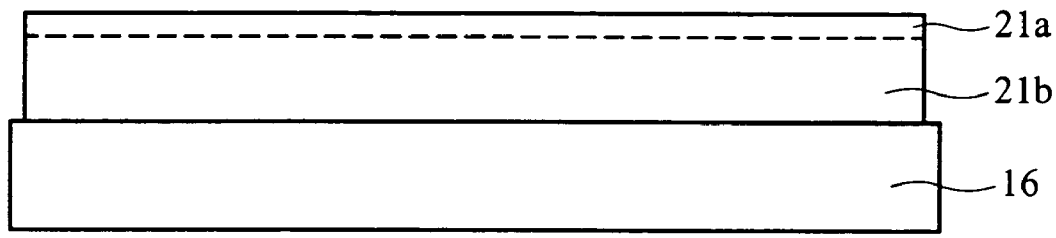
FIG. 4B is a side view of a shadow mask structure of one embodiment of the present invention.
Figure 5A:
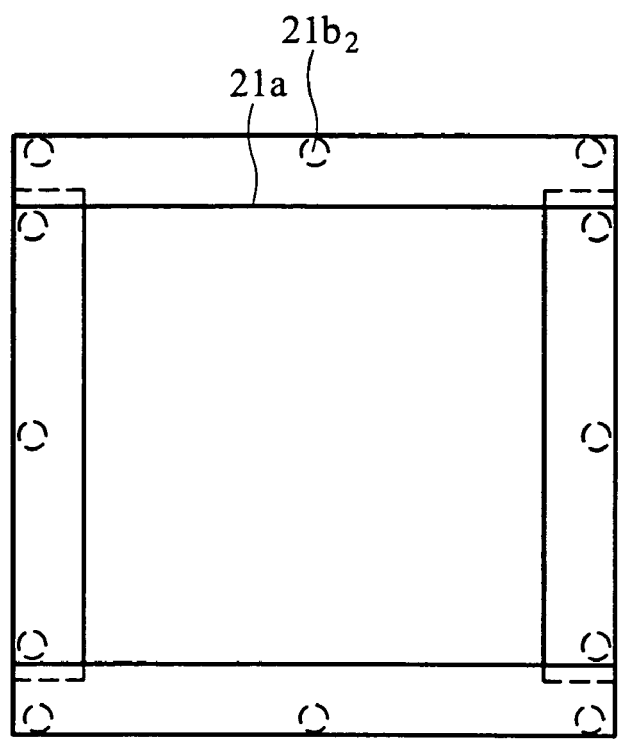
FIG. 5A is a top view of a shadow mask structure of another embodiment of the present invention.
Figure 5B:
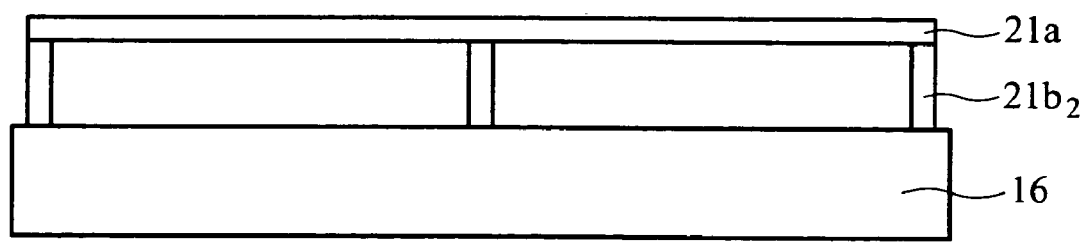
FIG. 5B is a top view of a shadow mask structure of another embodiment of the present invention.
Figure 6:
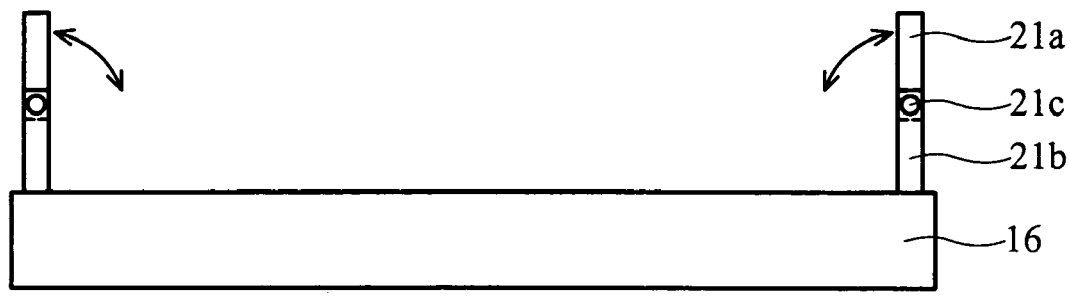
FIG. 6 is a schematic view of the baffle plate rotating out of the way to allow the substrate to be able to be placed or removed from the stage.

A shadow mask structure 21 comprises a support structure 21b, a rotatable structure 21c and a baffle plate 21a. The baffle plate 21a illustrated in FIG. 4 may consist of, but be not limited to, four baffle plates. Two baffle plates at two opposing sides, between which the laser scan laterally, can also applied to embodiments of the invention. The support structure 21b can be replaced with a support plate $21b_1$ as shown in FIGS. 4A and 4B or alternatively replaced with a support frame $21b_2$ as shown in FIGS. 5A and 5B. The support structure 21b is fixed to a movable plate 16 to support baffle plate 21a, and is capable of rotation for the substrate 18 able to move in and out. FIG. 6 shows a schematic of the baffle plate 21a rotating to a place for the substrate 18 able to move in and out.

Figure 7:
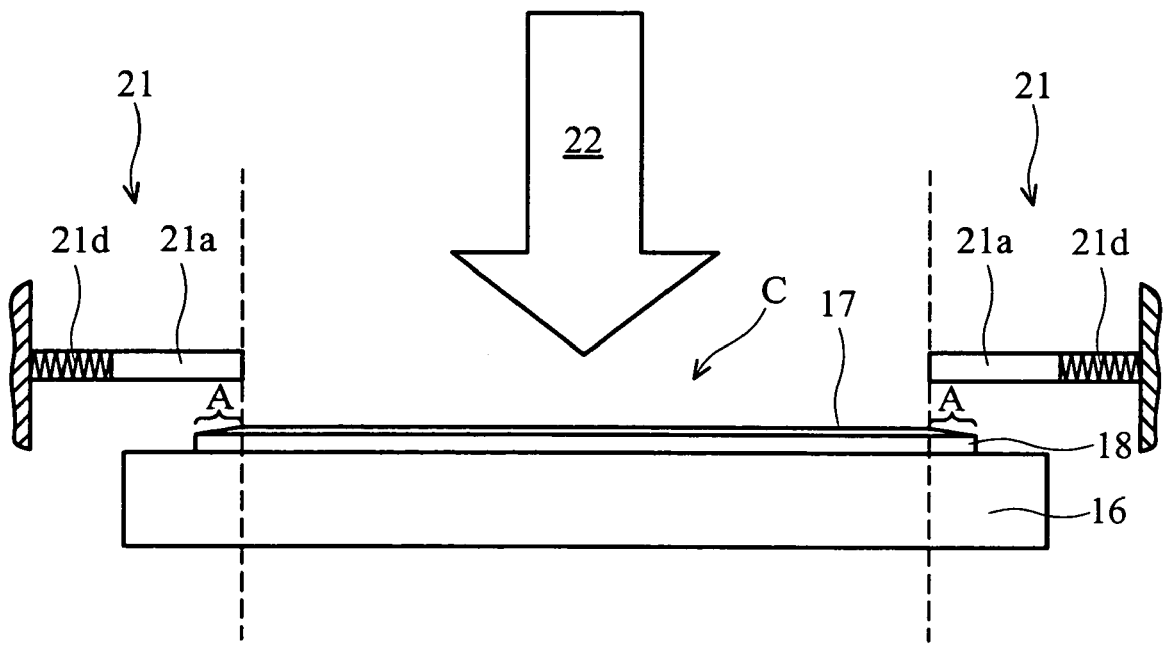
FIG. 7 is a schematic view of a process chamber for a laser annealing apparatus in accordance with another embodiment of the present invention.
Figure 8:
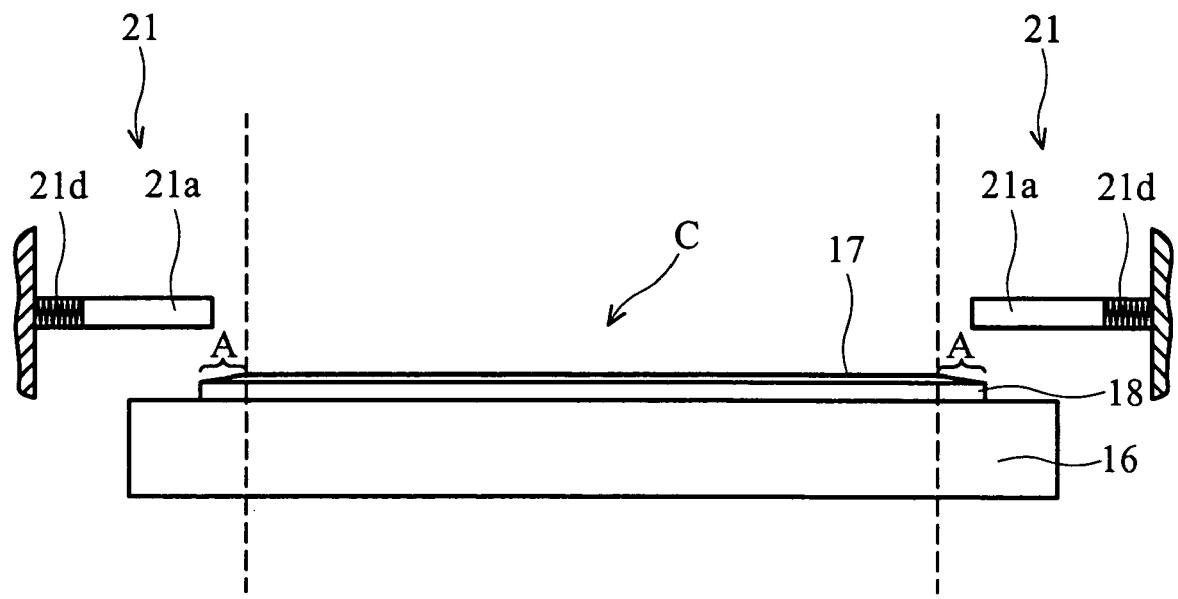
FIG. 8 is a schematic view of the baffle plate retracting out of the way to allow the substrate to be able to be placed or removed from the stage.

FIG. 7 shows a schematic of a process chamber for a laser annealing apparatus according to another embodiment of the present invention. A shadow mask structure 21 comprises a baffle plate 21a and a variable structure such as a resilient structure 21d (e.g., a spring member), wherein the resilient structure 21d can be fixed to an inner wall of a process chamber to support baffle plate 21a, enabling the shadow mask structure 21 to expand and contract. Alternatively, the variable structure may be a micro actuator or a screw drive indexing mechanism. FIG. 8 shows a schematic of the baffle plate 21a contracting to a place for the substrate 18 to be able to be placed on removed from the movable stage 16.

It is noted that while the embodiments described above show peripheral region A and the baffle plate 21a to be of the same width on every side of the amorphous layer 17, the region A and/or the baffle plate 21a may be set to be of different width on one or more sides of the amorphous layer 17.

Substrate 18 comprises a glass substrate. Preferably an amorphous silicon layer 17 is used, although other amorphous materials are also applicable in the present invention. Typically, a buffer layer (not shown), such as silicon nitride, is disposed between the amorphous layer 17 and substrate 18.

The baffle plate 21a comprises materials capable of reflecting or absorbing laser irradiation, and more preferably, comprises metal, such as Cr, Al, or Ag.

The above-described approach of baffle shielding to withstand laser beam at the peripheral region may be combined to effectively provide further protection the peripheral region against damage by the laser beam during the laser annealing process.

Figure 9:
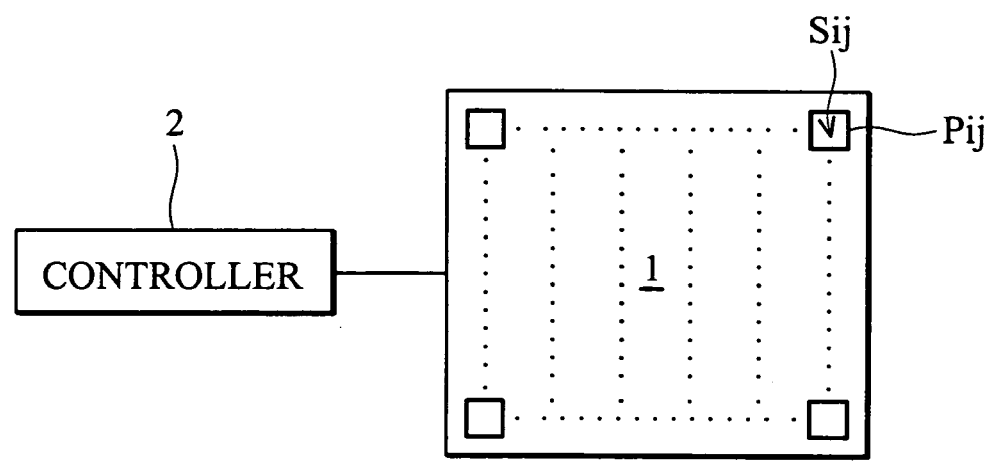
FIG. 9 is a schematic diagram of a display device comprising thin film transistors comprising the laser annealed polysilicon in accordance with embodiments of the invention.

FIG. 9 is a schematic diagram of a display device comprising thin film transistors comprising a polysilicon layer produced in a processing chamber in accordance with one embodiment of the present invention. A display panel 1 comprising an array of pixel units $P_{ij}$ and an array of switching devices $S_{ij}$, such as thin film transistors (TFTs), operatively coupled to the array of pixel unit $P_{ij}$. The switching device $S_{ij}$ comprises a polysilicon layer produced in a processing chamber in accordance with one embodiment of the present invention. The display panel 1 can be couple to a controller 2, forming a display device 3 as shown in FIG. 9. The controller 3 can comprise a source and a gate driving circuits (not shown) to control the display panel 1 to render an image in accordance with an input.

Figure 10:
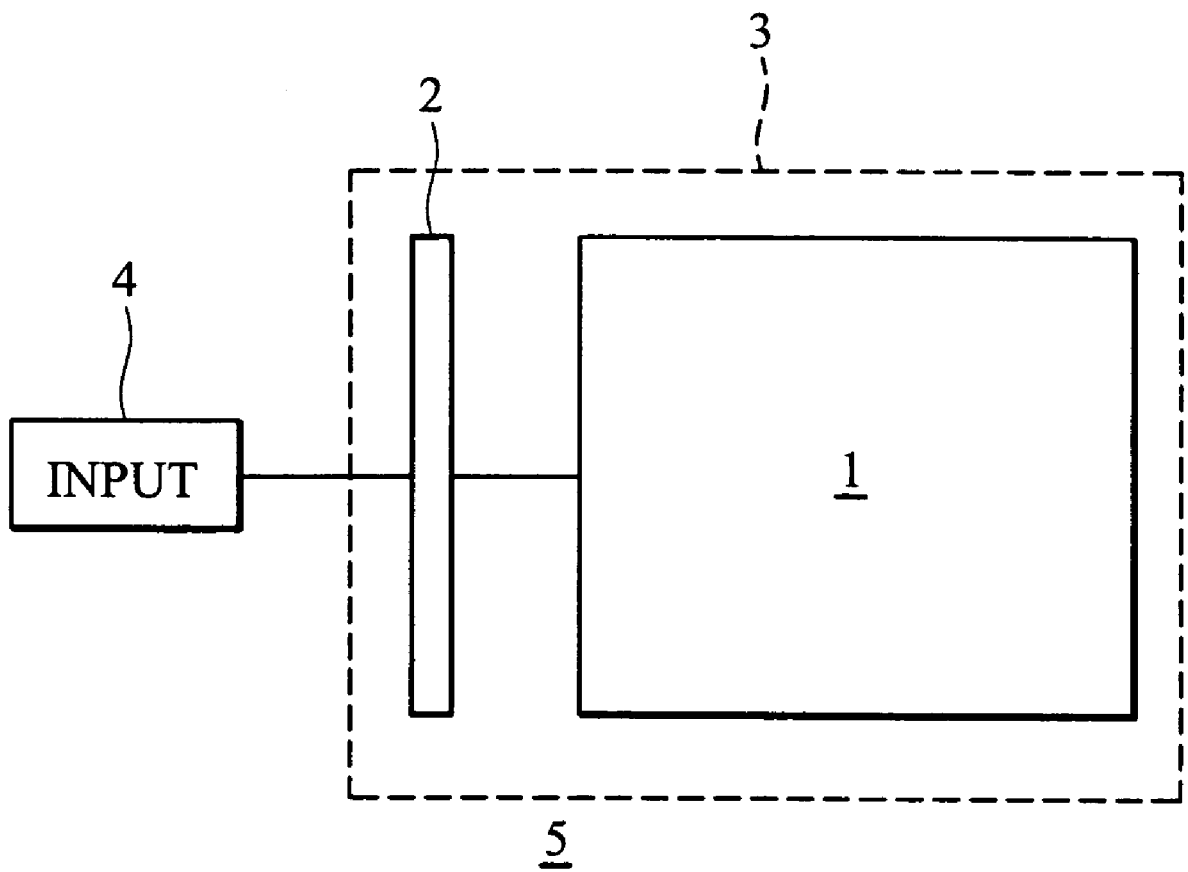
FIG. 10 is a schematic diagram of an electronic device comprising the display device in accordance with embodiments of the present invention.

FIG. 10 is a schematic diagram of an electronic device 5, incorporating a display comprising the switch element $S_{ij}$ having a polysilicon layer produced in a processing chamber in accordance with one embodiment of the present invention. An input device 4 is coupled to the controller 2 of the display device 3 shown in FIG. 10 can include a processor or the like to input data to the controller 2 to render an image. The electronic device 5 may be a portable device such as PDA, notebook computer, tablet computer, cellular phone, or desktop computer.

While the invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A processing chamber for laser annealing a silicon layer over a substrate, the silicon layer having a thinner thickness in a periphery region than in a main region, comprising:
   a stage for supporting the substrate; and
   a shadow mask structure positioned in relation to the stage, shielding the periphery region of the silicon layer from a laser beam when the silicon layer is subject to the laser beam during a laser annealing process, wherein the shadow mask structure comprises:
      a baffle plate; and
      a support structure fixed to the stage for supporting the baffle plate, wherein the support structure comprises a support frame fixed to the stage supporting the baffle plate in a manner that allows the baffle plate to be movable relative to the support frame to selectively shield the periphery region of the silicon layer.

2. The process chamber as claimed in claim 1, wherein the silicon layer is an amorphous silicon layer.

3. The process chamber as claimed in claim 2, wherein after laser annealing process, the amorphous silicon layer is transformed into a polycrystalline silicon layer.

4. A processing chamber for laser annealing a silicon layer over a substrate, the silicon layer having a thinner thickness in a periphery region than in a main region, comprising:
   a stage for supporting the substrate; and
   a shadow mask structure positioned in relation to the stage, shielding the periphery region of the silicon layer from a laser beam when the silicon layer is subject to the laser beam during a laser annealing process, wherein the shadow mask structure comprises:
      a baffle plate; and
      a support structure fixed to the stage for supporting the baffle plate, wherein the shadow mask structure further comprises a rotatable element for fixing the baffle plate to the support structure in a rotatable condition.

5. A laser annealing apparatus, comprising:
   a processing chamber for laser annealing a silicon layer over a substrate, the silicon layer having a thinner thickness in a periphery region than in a main region, said processing chamber comprising:
      a stage for supporting the substrate; and
      a shadow mask structure positioned in relation to the stage, shielding the periphery region of the silicon layer from a laser beam that is directed at the silicon layer supported in the processing chamber during a laser annealing process, wherein the shadow mask structure comprises a baffle plate and a support structure movably supporting the baffle plate in relation to the support structure to selectively shield the periphery region of the substrate, wherein the support structure comprises a variable structure positioning the baffle plate variably in relation to the variable structure to selectively shield the periphery region of the silicon layer; and
   a controller controlling relative movements of the stage and the laser beam to expose various sections of the silicon layer to the laser beam to effect laser annealing.

6. The laser annealing apparatus as claimed in claim 5, wherein the silicon layer is an amorphous silicon layer.

7. The laser annealing apparatus as claimed in claim 6, wherein after laser annealing process, the amorphous silicon layer is transformed into a polycrystalline silicon layer.

8. The process chamber as claimed in claim 5, wherein the variable structure comprises a structure comprises a resilient structure.

9. The process chamber as claimed in claim 5, wherein the variable structure is supported by a wall of the processing chamber.

10. The process chamber as claimed in claim 5, wherein the variable structure comprises a micro actuator or a screw drive indexing mechanism.

11. A processing chamber for laser annealing a silicon layer over a substrate, the silicon layer having a thinner thickness in a periphery region than in a main region, comprising:
    a stage for supporting the substrate; and
    a shadow mask structure positioned in relation to the stage, shielding the periphery region of the silicon layer from a laser beam when the silicon layer is subject to the laser beam during a laser annealing process, wherein the shadow mask structure comprises:
       a baffle plate; and
       a support structure supporting the baffle plate in relation to the stage, wherein the support structure comprises a support frame movably supporting the baffle plate relative to the support frame to selectively shield the periphery region of the silicon layer, wherein the support frame comprises a variable structure positioning the baffle plate variably in relation to the variable structure to selectively shield the periphery region of the silicon layer.

12. The process chamber as claimed in claim 11, wherein the support structure is supported by a wall of the processing chamber.

* * * * *